(12) United States Patent
Cheng et al.

(10) Patent No.: US 10,943,992 B2
(45) Date of Patent: Mar. 9, 2021

(54) TRANSISTOR HAVING STRAIGHT BOTTOM SPACERS

(71) Applicant: INTERNATIONAL BUSINESS MACHINES CORPORATION, Armonk, NY (US)

(72) Inventors: Kangguo Cheng, Schenectady, NY (US); Christopher J. Waskiewicz, Rexford, NY (US); Michael P. Belyansky, Halfmoon, NY (US); Brent Alan Anderson, Jericho, VT (US); Muthumanickam Sankarapandian, Niskayuna, NY (US); Puneet Suvarna, Albany, NY (US); Hiroaki Niimi, Cahoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/407,564

(22) Filed: May 9, 2019

(65) Prior Publication Data

US 2020/0357894 A1 Nov. 12, 2020

(51) Int. Cl.
| | | |
|---|---|---|
| *H01L 21/8234* | (2006.01) | |
| *H01L 29/66* | (2006.01) | |
| *H01L 29/78* | (2006.01) | |
| *H01L 29/10* | (2006.01) | |
| *H01L 21/02* | (2006.01) | |
| *H01L 29/417* | (2006.01) | |
| *H01L 21/311* | (2006.01) | |

(52) U.S. Cl.
CPC ...... *H01L 29/6656* (2013.01); *H01L 21/0217* (2013.01); *H01L 21/0228* (2013.01); *H01L 21/02164* (2013.01); *H01L 21/02271* (2013.01); *H01L 21/31111* (2013.01); *H01L 29/1037* (2013.01); *H01L 29/41741* (2013.01); *H01L 29/66666* (2013.01); *H01L 29/7827* (2013.01)

(58) Field of Classification Search
CPC .............. H01L 21/70; H01L 21/8232; H01L 29/66007; H01L 21/02164; H01L 21/0217; H01L 21/823431; H01L 21/823468; H01L 27/0886; H01L 29/1037; H01L 29/41741; H01L 29/6656; H01L 29/66666; H01L 29/7827; H01L 29/785

See application file for complete search history.

(56) References Cited

U.S. PATENT DOCUMENTS

| | | | |
|---|---|---|---|
| 9,312,383 B1 | 4/2016 | Cheng et al. | |
| 9,368,572 B1 | 6/2016 | Cheng et al. | |
| 9,437,503 B1 | 9/2016 | Mallela et al. | |
| 9,761,728 B1 * | 9/2017 | Cheng | H01L 29/7827 |
| 9,799,749 B1 | 10/2017 | Bi et al. | |
| 9,865,730 B1 | 1/2018 | Jagannathan et al. | |

(Continued)

*Primary Examiner* — Cheung Lee
(74) *Attorney, Agent, or Firm* — Cantor Colburn LLP; Joseph Petrokaitis

(57) ABSTRACT

An integrated semiconductor device having a substrate and a vertical field-effect transistor (FET) disposed on the substrate. The vertical FET includes a fin and a bottom spacer. The bottom spacer further includes a first spacer layer and a second spacer layer formed on top of the first spacer layer. The bottom spacer provides for a symmetrical straight alignment at a bottom junction between the bottom spacer and the fin.

20 Claims, 4 Drawing Sheets

(56) References Cited

U.S. PATENT DOCUMENTS

| | | |
|---|---|---|
| 9,941,391 B2 | 4/2018 | Gluschenkov et al. |
| 9,972,494 B1 | 5/2018 | Bentley et al. |
| 2018/0006025 A1 | 1/2018 | Hook et al. |
| 2018/0012993 A1 | 1/2018 | Cheng et al. |
| 2018/0047828 A1* | 2/2018 | Gluschenkov ...... H04M 1/0264 |

* cited by examiner

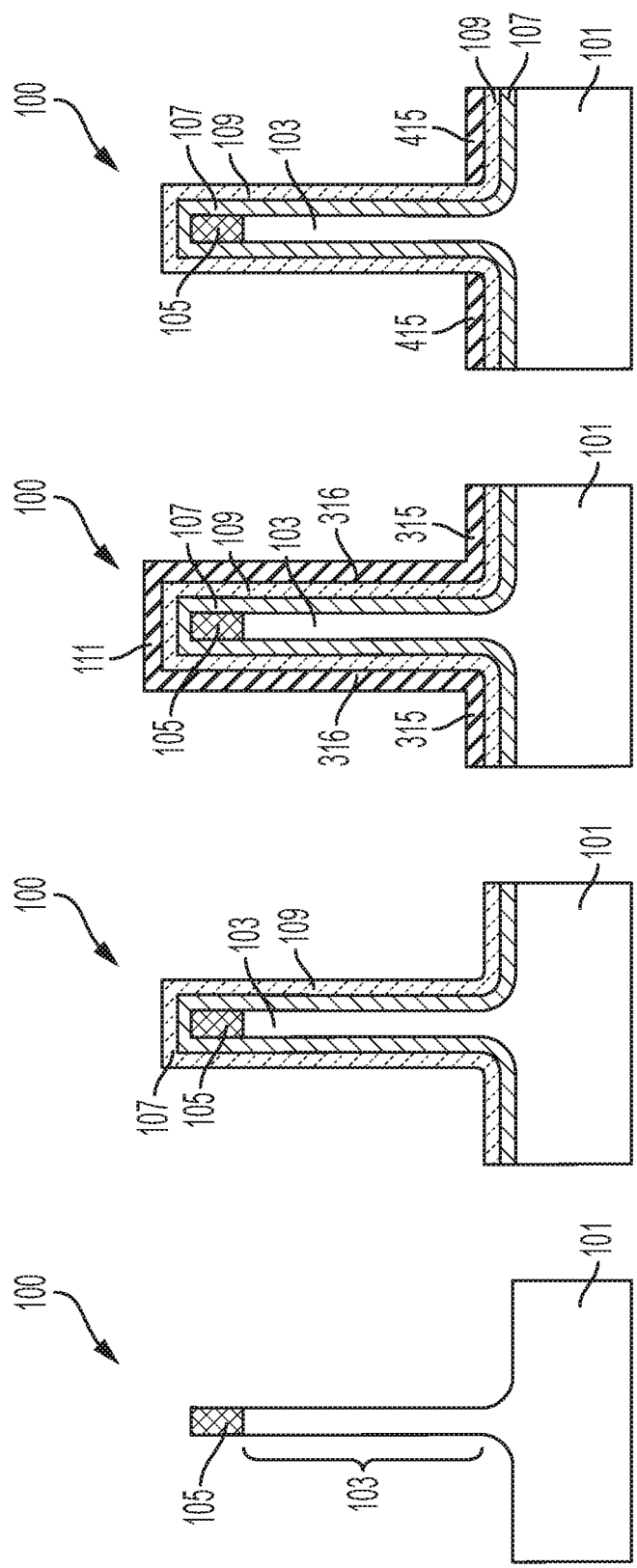

TRANSISTOR HAVING STRAIGHT BOTTOM SPACERS

BACKGROUND

The present invention generally relates to fabrication methods and resulting structures for semiconductor devices. More specifically, the present invention relates to a transistor device having one or more strait bottom spacers.

Vertical field-effect transistors (VFETs) are a promising non-planar transistor architecture for beyond 7 nm complementary metal-oxide-semiconductor (CMOS) technology. VFETs have recently been developed to achieve a reduced field-effect transistor (FET) device footprint without compromising necessary FET device performance characteristics.

In known VFET architectures, spacers need to be provided between and around the vertical fin of the VFET structure. The formation of such spacers, and more specifically, bottom spacers generally require that a directional deposition process be executed. The directional deposition process often requires additional treatments aimed at removing deposited materials from fin sidewalls of the VFET.

SUMMARY

According to a non-limiting embodiment of the present invention, an integrated semiconductor device is provided that includes a substrate and a vertical field-effect transistor (FET) disposed on the substrate. The vertical FET includes a fin and a bottom spacer. The bottom spacer further includes a first spacer layer and a second spacer layer formed on top of the first spacer layer. The bottom spacer provides for a symmetrical straight alignment at a bottom junction between the bottom spacer and the fin.

Embodiments of the present invention are further directed to a method for fabricating an integrated semiconductor device. A non-limiting example of the method includes providing a substrate and forming a vertical field-effect transistor (FET) on the substrate. The vertical FET includes a fin and a bottom spacer. The bottom spacer layer includes a first spacer layer and a second spacer layer formed on top of the first spacer layer. The bottom spacer provides a symmetrical straight alignment at a bottom junction between the bottom spacer and the fin.

According to yet another non-limiting embodiment, a method of fabricating an integrated semiconductor device includes providing a doped substrate and forming a fin on the doped substrate. The method further includes forming a bottom spacer to provide a symmetrical straight alignment at a bottom junction between the bottom spacer and the fin.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings.

FIGS. 1-7 depict cross-sectional views of a semiconductor device after fabrication operations for forming an IC with vertical field effect transistors (VFETs) having symmetrically aligned and substantially straight bottom spacer, in which:

FIG. 1 depicts a cross-sectional view illustrating a structure that results from performing initial fabrication operations in accordance with embodiments of this invention;

FIG. 2 depicts a cross-sectional view illustrating fabrication operations in accordance with embodiments of the invention;

FIG. 3 depicts a cross-sectional view illustrating fabrication operations in accordance with embodiments of the invention;

FIG. 4 depicts a cross-sectional view illustrating fabrication operations in accordance with embodiments of the invention;

FIG. 5 depicts a cross-sectional view illustrating fabrication operations in accordance with embodiments of the invention;

FIG. 6 depicts a cross-sectional view illustrating fabrication operations in accordance with embodiments of the invention; and FIG. 7 depicts a cross-sectional view illustrating fabrication operations in accordance with embodiments of the invention.

FIGS. 8-10 depict cross-sectional views of a semiconductor device after fabrication operations for forming an IC with a recess in a bottom junction region to provide for a longer fin, in which:

FIG. 8 depicts a cross-sectional view illustrating a structure that results from performing initial fabrication operations in accordance with embodiments of this invention;

FIG. 9. depicts a cross-sectional view illustrating fabrication operations in accordance with embodiments of the invention; and FIG. 10 depicts a cross-sectional view illustrating fabrication operations in accordance with embodiments of the invention.

FIGS. 11-13 depict cross-sectional views of a semiconductor device after fabrication operations for forming an IC, where a bilayer bottom spacer is formed having each layer being the same material, in which:

FIG. 11 depicts a cross-sectional view illustrating a structure that results from performing initial fabrication operations in accordance with embodiments of this invention;

FIG. 12 depicts a cross-sectional view illustrating a structure that results from performing initial fabrication operations in accordance with embodiments of this invention; and FIG. 13 depicts a cross-sectional view illustrating fabrication operations in accordance with embodiments of the invention.

Figure 7:
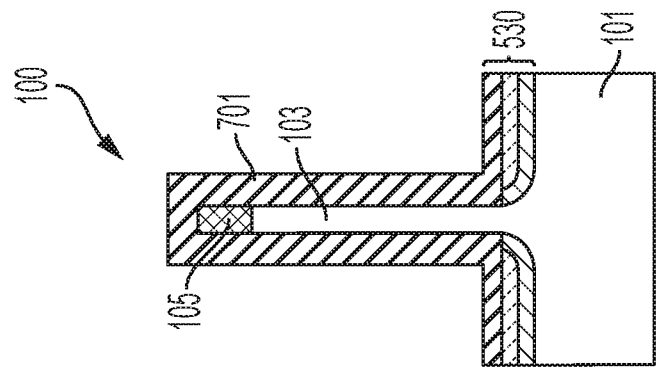

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

VFETs are a promising non-planar transistor architecture for beyond 7 nm complementary metal-oxide-semiconductor (CMOS) technology. VFET have recently been developed to achieve a reduced field-effect transistor (FET) device footprint without compromising necessary FET device performance characteristics. More specifically, VFETs are one of the alternatives to standard lateral (or planar) FET structures due to benefits, among others, in terms of reduced device footprint. In this type of structure, the current flow is perpendicular to a supporting wafer, rather than a lateral current flow of, for example, fin-based FETs.

However, directional deposition processes such as, for example, high density plasma chemical vapor deposition (HDP CVD), for a bottom spacer fabrication are sensitive to incoming pitch walking, which can cause high inter-fin spacer height variation. Directional film deposition techniques usually produce a non-uniform step coverage inside a feature, mostly bottom thick with thin film on a feature sidewalls. This differentiates directional techniques like HDP CVD and PVD (Physical Vapor Deposition) from conventional conformal film deposition techniques (general CVD or atomic layer deposition (ALD) that result in conformal film step coverage with very similar bottom/top and sidewall film thicknesses. In some instances, electron dissociation and ion bombardment can result in contamination diffusion into the vertical silicon fins. The HDP CVD process is typically very sensitive to the dimensions of the incoming structure (top opening and height) and in general to the volume of the feature, which can lead to inter-fin spacer variation at amounts typically greater than 2 nanometers (nm) during fabrication of semiconductor structures, including VFETs of different patterning density regions. In addition, the HDP CVD utilizes precursors that typically include hydrogen, e.g., silane gas (SiH4) for deposition of silicon containing dielectrics, which are known to create spacer variations during downstream processing such as, for example, during a BHF high-k dielectric pre-clean step because hydrofluoric acid (HF) is known to attack hydrogen-rich silicon oxide and nitride films. Moreover, generally when a fluorine containing gas is used as a cleaning agent inside a deposition chamber (NF3 or the like) the ion bombardment during HDP CVD can cause fluorine ion diffusion into the fins, which can affect device mobility, stability, and the like.

Further, controlling a bottom junction in VFETs is difficult with existing approaches. Processing currently used results in bottom spacers being flared up near the fins resulting in a large distance between the source and drain (S/D) structures and a gate edge. This can cause an increased resistance and degradation of the bottom junction.

Turning now to an overview of the aspects of the invention, one or more embodiments of the invention address the above-described shortcomings of the prior art by providing an FET device with bottom spacers that provide a symmetrical alignment between a gate metal and a bottom junction, rather than bottom spacers that flare up near the bottom junction. The flare up of the bottom spacers can result in increased distance between the S/D structures and the gate metal. More specifically, as illustrated in FIGS. 1-13, the FET device according to embodiments of the present invention has the bottom spacers that are substantially parallel to a semiconductor substrate and perpendicular to the fins to provide for the alignment at the bottom junction which is substantially free from the flare up at the ends of the bottom spacers that are proximal to the fins. In other words, the bottom spacers according to embodiments of the present invention have substantially uniform thickness throughout. In another aspect of the present invention, the bottoms spacers can be bilayer, each layer being made of different or same material for increased performance of the FET device, for example, a combination of silicon oxide, silicon nitride or other dielectric material with a relatively low k-value in between SiO2 k of 4 and SiN k of 7.

Turning now to a more detailed description of aspects of the present invention, FIGS. 1-7 depict cross-sectional views of a portion of semiconductor structure 100 after fabrication operations for forming an IC with VFETs having a symmetrically aligned and substantially straight bottom spacer in accordance with aspects of the invention. Referring initially to FIG. 1, there is shown a cross-sectional view of the semiconductor structure 100 after known fabrication operations are used to form a fin 103 on a semiconductor substrate 101. The number of fins on the semiconductor substrate 101 is not intended to be limited to a single fin 103, shown on FIG. 1, but rather multiple number of fins can be present. The fin 103 has a vertical orientation with respect to the semiconductor substrate 101. A hard mask 105, which was used to define a pattern and form the fin 103 on the substrate 101, is present on the fin 103.

The fin 103 can be formed from any semiconductor material, for example, silicon (Si, Ge or SiGe). The fin 103 can be coupled with a bottom electrode region (not shown), i.e., source and drain (S/D) region of the VFETs. The bottom electrode region can be formed by an epitaxial growth process that deposits a crystalline semiconductor material onto selected areas of the semiconductor substrate 101 to form S/D region. The bottom electrode region can be formed before or after the formation of fins.

The semiconductor substrate 101 can be formed of any semiconductor material including, for example, Si, Ge, SiGe, silicon carbide (SiC), silicon germanium carbide (SiGeC) or other like semiconductor materials. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide. The semiconductor substrate 101 can also have multiple layers, for example, a semiconductor-on-insulator (SOI) substrate, a germanium-on-insulator (GeOI) substrate or a silicon-germanium-on-insulator (SGOI) substrate. A portion or entire semiconductor substrate 101 can be amorphous, polycrystalline, or monocrystalline. In addition to the aforementioned types of semiconductor substrates, the semiconductor can also have a hybrid oriented (HOT) semiconductor substrate in which the HOT substrate has surface regions of different crystallographic orientation. The semiconductor substrate 101 can be doped, undoped or contain doped regions and undoped regions therein. The semiconductor substrate can contain regions with strain and regions without strain therein, or contain regions of tensile strain and compressive strain.

The hard masks 105 can be formed by any conventional methods, such as, for example, chemical vapor deposition (CVD), plasma-enhanced chemical vapor deposition (PECVD), chemical solution deposition, atomic layer deposition, or physical vapor deposition. Alternatively, the hard mask layer can be formed utilizing a thermal oxidation, nitridation or oxynitridation process. The hard mask material can be a dielectric material such as, for example, an oxide, nitride, oxynitride or a multilayered stack thereof. In embodiments of the invention, the hard mask material is silicon mononitride (SiN).

In FIG. 2, an oxide layer 107 is conformally deposited by known fabrication operations, for example, an atomic layer deposition (ALD) process. More specifically, the oxide layer 107 is formed on top of the semiconductor substrate 101 and around the fin 103 and the hard mask 105. The oxide layer 107 can include silicon oxide such as, tetraethylorthosilicate (TEOS) based oxide, thermally grown oxide, high temperature oxide (HTO), low temperature oxide (LTO), high density plasma (HDP) oxide, and other CVD or ALD oxides (e.g., silicon oxides), or any combination thereof.

In addition, in FIG. 2, known fabrication operations have been used to deposit a nitride liner layer 109 on top of the oxide layer 107 over the semiconductor substrate 101, the fin 103 and the hard mask 105. The nitride liner layer 109 can include so called lower k materials like dielectric nitrides (e.g., silicon nitride, SiBCN), dielectric oxynitrides (e.g., SiOCN), or any combination thereof or the like. Some examples of the dielectric material include, but are not limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. The dielectric material can be a low-k material having a dielectric constant less than about 7, less than about 5. The dielectric material can be deposited by, for example, atomic layer deposition (ALD), chemical vapor deposition (CVD).

In FIG. 3, known fabrication operations, for example, HDP, have been used to deposit a non-conformal oxide layer 111 on top of the nitride liner layer 109, over the semiconductor substrate 101, the fin 103 and the hard mask 105. The non-conformal oxide layer 111 includes thick regions 315. The thick regions 315 cover portions of the nitride liner layer 109 that are parallel to the semiconductor substrate 101. On the other hand, regions 316 of the non-conformal oxide layer 111 are parallel to the fin's 103 walls and perpendicular to the semiconductor substrate 101. The non-conformal oxide layer 111 can be made of, for example, silicon dioxide.

In FIG. 4, known fabrication operations have been used to remove the regions 316 of the non-conformal oxide layer 111. As illustrated in FIG. 4, the thick regions 315 have been thinned to result in bottom hard masks 415. An aqueous etch solution containing hydrofluoric acid (HF) acid can be used to remove the regions 316 and thin the thick regions 315.

Figure 5:
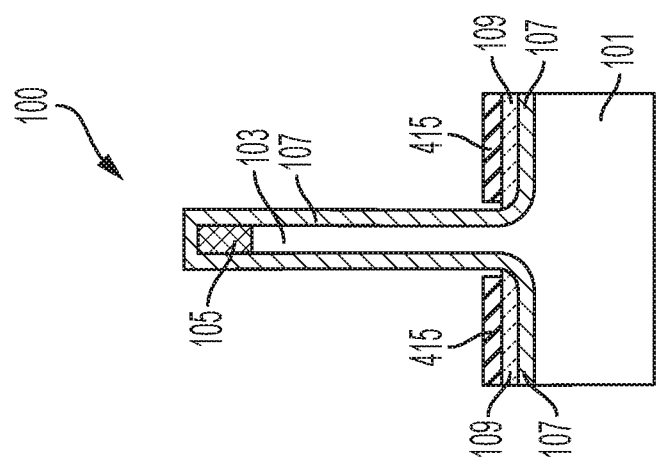

In FIG. 5, known fabrication operations, for example, suitable nitride etch processes, have been used to selectively remove the portions of the nitride liner layer 109 that cover the fin 103 and the hard mask 105, thereby exposing the portions of the oxide layer 107 that cover the fin 103 and the hard mask 105. An aqueous etch solution containing phosphoric acid can be used to remove the exposed portions of the nitride liner layer 109.

Figure 6:
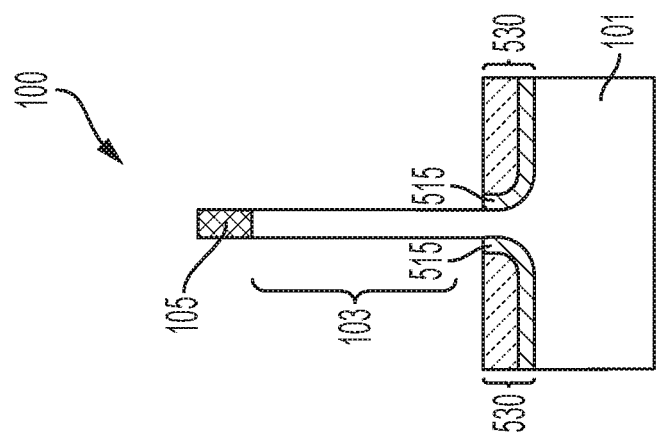

In FIG. 6, known fabrication operations, for example, oxide etching processes, have been used to selectively remove the portions of the oxide layer 107 from the fin 103 and the hard mask 105. In addition, the bottom hard masks 415 are also removed thereby exposing the portions of the nitride liner layer 109 that are parallel to the semiconductor substrate 101 and forming bottom junction regions 515 on the opposite sides of the fin 103. The portions of the oxide layer 107 and the nitride liner layer 109 that are parallel to the semiconductor substrate 101 form a bilayer bottom spacer 530. As illustrated in FIG. 6, the bottom spacer 530 is substantially perpendicular to the fin 103 and substantially parallel with the semiconductor substrate 101 to provide for a straight alignment at a bottom junction region. Accordingly, the bottom spacer 530 is free from the flare up at the end of the bottom spacer 530 that is proximal to the fin 103 and has a uniform thickness throughout. Suitable etch processes include, for example, reactive ion etch (RIE).

In FIG. 7, known fabrication operations have been used to form a gate structure 701 over the fin 103, the hard mask 105, and the top portion of the bottom spacer 530. The gate structure 701 can include a gate dielectric (e.g., high-k dielectric material) and gate conductor materials (e.g., metal gate). Gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In embodiments of the present invention, the gate dielectric has a thickness ranging from 1 nm to 5nm, although less thickness and greater thickness are also possible.

The gate conductor material can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In embodiments of the present invention, the gate may further include a workfunction setting layer (not shown) between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In embodiments of the present invention, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Conventional downstream processes can be then used to complete fabrication of the VFETs in the semiconductor structure 100, which generally can include patterning the gate, forming a top spacer layer (not shown), respective top electrodes (i.e., source regions), and metal contacts (not shown) coupled to the top electrodes.

Figure 8:
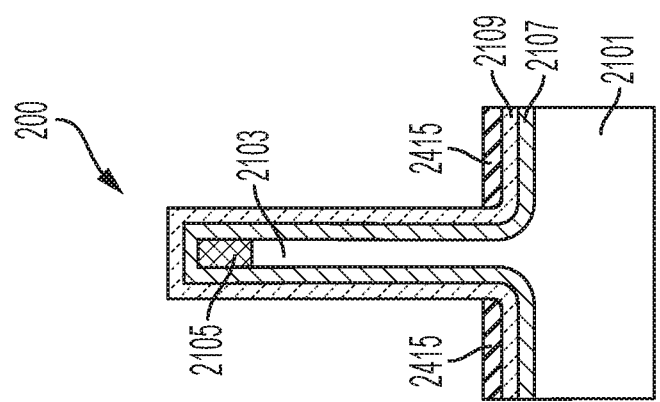
Figure 9:
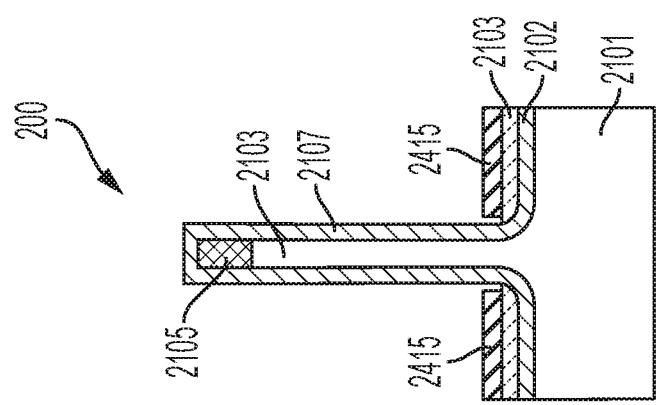
Figure 10:
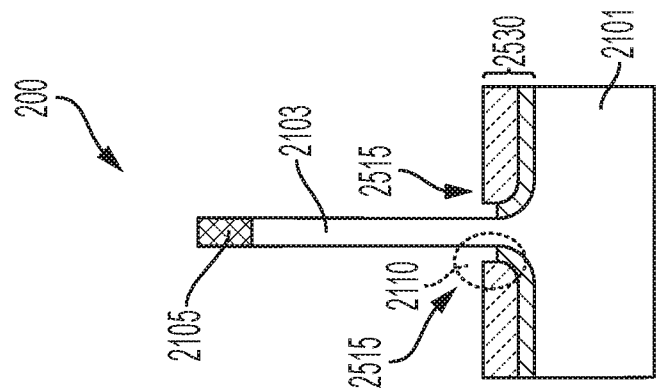

FIGS. 8-10 depict cross-sectional views of a semiconductor structure 200 after fabrication operations for forming a FET device having a recess in a bottom junction region to provide for a longer fin in accordance with aspects of the invention. FIG. 8 depicts a cross-sectional view of the structure 200 that results from performing initial fabrication operations according to embodiments of the invention. More specifically, after performing initial fabrication operations described in FIGS. 1-3, the resulting semiconductor structure 200 has a fin 2103 formed on a semiconductor substrate 2101. The fin 2103 has a vertical orientation with respect to the semiconductor substrate 2101. A hard mask 2105 is formed by conventional deposition operations on the fin 2103. An oxide liner layer 2107 is conformally deposited by known fabrication operations, for example, an atomic layer deposition (ALD) process. More specifically, the oxide layer 2107 is formed on top of the semiconductor substrate 2101 and around the fin 2103 and the hard mask 2105. A nitride liner layer 2109 is formed on top of the oxide layer 2107 over the semiconductor substrate 2101, the fin 2103 and the hard mask 2105. Bottom hard masks 2415 have been formed by the fabrication operations illustrated in FIG. 4. The bottom hard masks 2415 can be made of, for example, silicon dioxide.

In FIG. 9, known fabrication operations, for example, suitable nitride etch processes, have been used to selectively remove the portions of the nitride liner layer 2109, which cover the fin 2103 and the hard mask 2105, thereby exposing the portions of the oxide layer 2107 that cover the fin 2103 and the hard mask 2105.

In FIG. 10, known fabrication operations, for example, any suitable oxide etching process, have been used to selectively remove the portions of the oxide layer 2107 from the fin 2103 and the hard mask 2105. In addition, the bottom hard masks 2415 are also removed thereby exposing the portions of the nitride liner layer 109 that are parallel to the semiconductor substrate 2101 and forming bottom junction regions 2515 on the opposite sides of the fin 2103. A gate recess 2110 is formed in the bottom junction regions 2515 on both sides of the fin 2103 to provide for longer Lgate (Lg).

The portions of the oxide layer 2107 and the nitride liner layer 2109 that are parallel to the semiconductor substrate 2101 form a bilayer bottom spacer 2530, where the top layer is a nitride layer and the bottom layer is an oxide layer. As illustrated in FIG. 10, the bottom spacer 2530 is substantially perpendicular to the fin 2103 and substantially parallel with the semiconductor substrate 2101 to provide for a straight alignment at the bottom junction region. Accordingly, the bottom spacer 2530 is free from the flare up at the end of the bottom spacer 2530 that is proximal to the fin 2103 and has a uniform thickness throughout.

Conventional downstream processes can be then used to complete fabrication of the VFETs in the semiconductor structure 200, which generally can include forming a metal gate material layer (as shown in FIG. 7), a top spacer layer (not shown), respective top electrodes (i.e., source regions), and metal contacts (not shown) coupled to the top electrodes.

Figure 13:
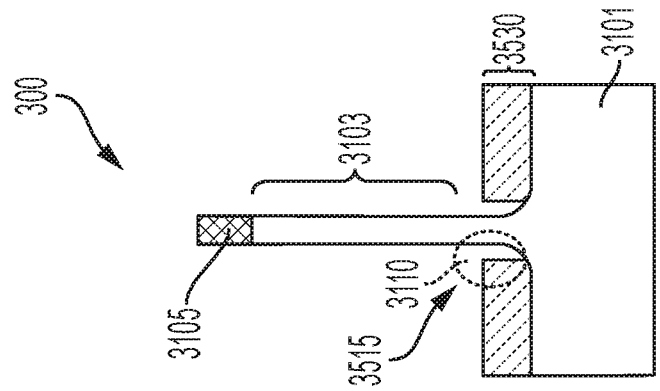
Figure 12:
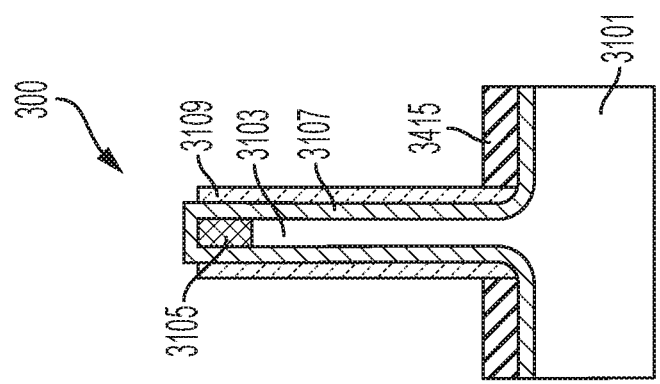
Figure 11:
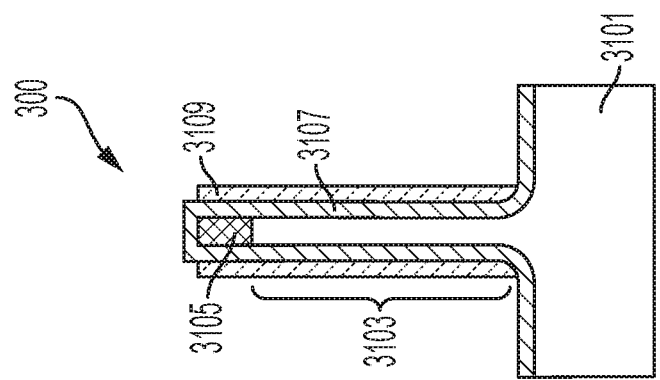

Referring now to FIGS. 11-13, which show an alternative embodiment of the present invention, where a bilayer bottom spacer is formed having each layer being the same material, for example, silicon dioxide.

FIG. 11 depicts a cross-sectional view of a structure 300 that results from performing initial fabrication operations according to embodiments of the invention. More specifically, after performing initial fabrication operations the resulting semiconductor structure 300 has a fin 3103 formed on a semiconductor substrate 3101. The fin 3103 can be substantially vertically oriented with respect to the semiconductor substrate 3101. A hard mask 3105 is formed by conventional deposition operations on the fin 3103. An oxide liner layer 3107 is conformally deposited by known fabrication operations, for example, an atomic layer deposition (ALD) process. More specifically, the oxide layer 3107 is formed on top of the semiconductor substrate 2101 and around the fin 2103 and the hard mask 2105. A nitride liner layer 3109 is formed on sidewalls of the fin 3103 on top of the oxide layer 3107 and the sidewalls of a hard mask 3105, as illustrated in FIG. 11. In other words, the nitride liner layer 3109 does not cover the semiconductor substrate 3101 or a top of the hard mask 3105. This can be achieved by conventional fabrication processes, for example, by initially depositing a conformal ALD nitride (e.g., SiN) liner (not shown) around the structure 300, and subsequently removing the portions of the nitride liner from top and bottom of the structure 300 by spacer RIE process, thereby leaving the nitride liner layer 3109 on sidewalls of the fin 3103.

In FIG. 12, bottom hard masks 3415 have been formed by known fabrication operations. The bottom hard masks 3415 can be made of the same material as oxide liner layer 3107, for example, silicon dioxide. Accordingly, the semiconductor substrate is covered by two layers of the same material (e.g., silicon dioxide) on both sides of the fin 3103. The bottom hard masks 3415 can be formed by undoped silicate glass (USG) deposition, HDP and the like.

In FIG. 13, known fabrication operations have been used to remove the nitride liner layer 3109. Subsequently, suitable oxide etching processes, have been used to selectively remove the portions of the oxide layer 3107 from the fin 3103 and the hard mask 3105 thereby forming bottom junction regions 3515 on the opposite sides of the fin 3103. A gate recess 3110 is formed by known fabrication operations in the bottom junction regions 3515 on both sides of the fin 3103 to provide for longer Lgate (Lg).

The portions of the oxide layer 3107 and the bottom hard masks 3415, which are parallel to the semiconductor substrate 3101, form a bilayer bottom spacer 3530, where the top layer and the bottom layer are oxide layers. As illustrated in FIG. 13, the bottom spacer 3530 is substantially perpendicular to the fin 3103 and substantially parallel with the semiconductor substrate 3101 to provide for a straight alignment at the bottom junction region. Accordingly, the bottom spacer 3530 is free from the flare up at the end of the bottom spacer 3530 that is proximal to the fin 3103 and has a uniform thickness throughout.

Conventional downstream processes can be then used to complete fabrication of the VFETs in the semiconductor structure 300, which generally can include forming a metal gate material layer (as shown in FIG. 7), a top spacer layer (not shown), respective top electrodes (i.e., source regions), and metal contacts (not shown) coupled to the top electrodes.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a (100) orientated crystalline surface can take on a (100) orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
    a substrate; and
    a vertical field-effect transistor (FET) disposed on the substrate, wherein the vertical FET comprises:
        a gate;
        a fin; and
        a bilayer bottom spacer comprising a first spacer layer and a second spacer layer formed on top of the first spacer layer, wherein the first spacer layer is in direct conformal contact with the substrate and a sidewall of the fin, wherein a sidewall of the first spacer layer is in direct contact with the gate, wherein the second spacer layer is between the first spacer layer and the gate, and wherein the sidewall of the first spacer layer is recessed from a topmost surface of the second spacer layer; and
    wherein the bilayer bottom spacer provides a symmetrical straight alignment at a bottom junction between the bilayer bottom spacer and the fin.

2. The device according to claim 1, wherein the first spacer layer comprises a first spacer material and the second spacer layer comprises a second spacer material different from the first spacer material.

3. The device according to claim 2, wherein the first spacer material comprises silicon dioxide.

4. The device according to claim 2, wherein the second spacer material comprises a nitride.

5. The device according to claim 1, wherein the first spacer layer and the second spacer layer comprise an oxide.

6. The device according to claim 1 further comprising a metal gate layer formed over the fin and the bilayer bottom spacer.

7. The device according to claim 1, wherein the substrate comprises dopants.

8. A method of fabricating a semiconductor device, the method comprising:
providing a substrate;
forming a vertical field-effect transistor (FET) on the substrate, wherein the vertical FET comprises:
a gate;
a fin; and
a bilayer bottom spacer comprising a first spacer layer and a second spacer layer formed on top of the first spacer layer, wherein the first spacer layer is in direct conformal contact with the substrate and a sidewall of the fin, wherein a sidewall of the first spacer layer is in direct contact with the gate, wherein the second spacer layer is between the first spacer layer and the gate, and wherein the sidewall of the first spacer layer is recessed from a topmost surface of the second spacer layer; and
wherein the bilayer bottom spacer provides a symmetrical straight alignment at a bottom junction between the bilayer bottom spacer and the fin.

9. The method according to claim 8, wherein the first spacer layer comprises a first spacer material and the second spacer layer comprises a second spacer material different from the first spacer material.

10. The method according to claim 9, wherein the first spacer material comprises silicon dioxide.

11. The method according to claim 9, wherein the second spacer material comprises a nitride.

12. The method according to claim 8, wherein the first spacer layer and the second spacer layer comprise an oxide.

13. The method according to claim 8, wherein forming the vertical FET further comprises forming a recess at the bottom junction.

14. The method according to claim 8 further comprising forming a metal gate layer over the fin and the bilayer bottom spacer.

15. The method according to claim 8 further comprising:
forming a top spacer layer;
forming top electrodes; and
forming metal contacts coupled to the top electrodes.

16. A method of fabricating a semiconductor device, the method comprising:
providing a doped substrate;
forming a fin on the doped substrate;
forming a bottom spacer to provide a symmetrical straight alignment at a bottom junction between the bottom spacer and the fin, wherein the bottom spacer comprises a first spacer layer in direct conformal contact with the substrate and a sidewall of the fin, wherein a sidewall of the first spacer layer is in direct contact with a gate, and wherein a second spacer layer is between the first spacer layer and the gate;
recessing the sidewall of the first spacer layer from a topmost surface of the second spacer layer; and
forming the gate on sidewalls of the fin and on the recessed sidewall of the first spacer layer.

17. The method according to claim 16, wherein the bottom spacer comprises the first spacer layer and the second spacer layer formed on top of the first spacer layer.

18. The method according to claim 17, wherein the first spacer layer comprises a first spacer material and the second spacer layer comprises a second spacer material different from the first spacer material.

19. The method according to claim 18, wherein the first spacer material comprises an oxide and the second spacer material comprises a nitride.

20. The method according to claim 17, wherein the first spacer layer and the second spacer layer comprise an oxide.

* * * * *